(12) United States Patent
Glass (10) Patent No.: US 8,111,091 B2
(45) Date of Patent: Feb. 7, 2012

(54) HIGH SPEED TRACK AND HOLD CIRCUIT

(75) Inventor: Kevin William Glass, Scottsdale, AZ (US)

(73) Assignee: Semtech Corporation, Camarillo, CA (US)

( * ) Notice: Subject to any disclaimer, the term of this patent is extended or adjusted under 35 U.S.C. 154(b) by 53 days.

(21) Appl. No.: 12/551,447

(22) Filed: Aug. 31, 2009

(65) Prior Publication Data

US 2011/0050287 A1    Mar. 3, 2011

(51) Int. Cl.
  *G11C 27/02*    (2006.01)
  *H03K 5/00*    (2006.01)
  *H03K 17/00*    (2006.01)
(52) U.S. Cl. .......................................................... 327/96
(58) Field of Classification Search ...................... 327/96
  See application file for complete search history.

(56) References Cited

OTHER PUBLICATIONS

Baumheinrich, et al., "A 1-GSample/s 10-b Full Nyquist Silicon Bipolar Track&Hold IC," IEEE Journal of Solid-State Circuits, Dec. 1997, pp. 1951-1960, vol. 32, No. 12, IEEE.
Baumheinrich, et al., "A 1GSample/s 10b Full Nyquist Silicon Bipolar Track&Hold IC," IEEE International Solid-State Circuits Conference, ISSCC97/Session 8/Data Converters/Paper FA 8.6, 1997, pp. 142-143 and 444, IEEE.
Boni, et al., "Low-Power GS/s Track-and-Hold With 10-b Resolution at Nyquist in SiGe BiCMOS," IEEE Transactions on Circuits and Systems-II: Express Briefs, Jun. 2006, pp. 429-433, vol. 53, No. 6, IEEE.
Caiulo, et al., "On the Design of High-Speed High-Resolution Track and Holds," 1996, pp. 73-76, IEEE.
Fiocchi, et al., "A 10b 250MHz BiCMOS Track and Hold," IEEE International Solid-State Circuits Conference, ISSCC97/Session 8/Data Converters/Paper FA 8.7, 1997, pp. 144-145 and 444, IEEE.
Imamura, et al., "A 100-Msps Sampling Analog-to-Digital Converter Chip Set," IEEE Transactions on Instrumentation and Measurement, Apr. 1992, pp. 208-211, vol. 41, No. 2, IEEE.
Jensen, et al., "An 8bit 3GHz Si/SiGe HBT Sample-and-Hold," IEEE 2004 Custom Integrated Circuits Conference, 2004, pp. 655-658, IEEE.
Kobayashi, et al., "System Architecture and Key Components of a Multi-Giga-Hertz A/D Converter with HBT," IEEE Instrumentation and Measurement Technology Conference, Jun. 4-6, 1996, pp. 1160-1166, IEEE.
Matsuzawa, et al., "A 10b 30MHz Two-Step Parallel BiCMOS ADC with Internal S/H," IEEE International Solid-State Circuits Conference, ISSCC 90/ Thursday, Feb. 15, 1990/Imperial Ballroom/2:30 P.M., Session 10: Analog-to-Digital Converters, TPM 10.3, 1990, pp. 162-163 and 290, IEEE.
Nayebi, et al., "A 10-bit Video BiCMOS Track-and-Hold Amplifier," IEEE Journal of Solid-State Circuits, Dec. 1989, pp. 1507-1516, vol. 24, No. 6, IEEE.
Prégardier, et al., "A 1Gsample/s 8b Silicon Bipolar Track&Hold IC," IEEE International Solid-State Circuits Conference, ISSCC95/Session 3/Analog Techniques/Paper WP 3.6, 1995, pp. 58-59 and 340, IEEE.
Razavi, "Design of a 100-MHz 10-mW 3-V Sample-and-Hold Amplifier in Digital Bipolar Technology," IEEE Journal of Solid-State Circuits, Jul. 1995, pp. 724-730, vol. 30, No. 7, IEEE.

(Continued)

*Primary Examiner* — Lincoln Donovan
*Assistant Examiner* — Daniel Rojas
(74) *Attorney, Agent, or Firm* — McDermott Will & Emery LLP (57) ABSTRACT

Examples of systems and methods are provided for tracking-and-holding an input signal. The system may produce a pair of differential voltage outputs responsive to a pair of differential voltage inputs. The system may couple, in response to a clock signal, an input amplifier circuit to an output circuit or decouple the input amplifier circuit from the output circuit. The system may couple the input amplifier to an electrical ground. The system may track values of a pair of differential voltage outputs when a switching circuit is in a closed position and to hold the values of the pair of differential voltage outputs constant when the switching circuit is in an open position.

20 Claims, 9 Drawing Sheets

OTHER PUBLICATIONS

Reimann, et al., "An 8-b, 40 Msamples/s Switched-Current-Mode Track-and-Hold Circuit on a BiCMOS Sea-of-Gates Array," IEEE Journal of Solid-State Circuits, Mar. 1996, pp. 304-311, vol. 31, No. 3, IEEE.

Schillaci, et al., "A 3-V 5.4-mW BiCMOS Track&Hold Circuit with Sampling Frequency up to 150 MHz," IEEE Journal of Solid-State Circuits, Jul. 1997, pp. 926-932, vol. 32, No. 7, IEEE.

Shimizu, et al., "A 10-bit 20-MHz Two-Step Parallel A/D Converter with Internal S/H," IEEE Journal of Solid-State Circuits, Feb. 1989, pp. 13-20, vol. 24, No. 1, IEEE.

Venes, et al., "An 80MHz 80mW 8b CMOS Folding A/D Converter with Distributed T/H Preprocessing," IEEE International Solid-State Circuits, ISSCC96/Session 19/Data Conversion/Paper SA 19.4, 1996, pp. 318-319 and 466, IEEE.

Wakayama, et al., "A 1.2-μm BiCMOS Sample-and-Hold Circuit with a Constant-Impedance, Slew-Enhanced Sampling Gate," IEEE Journal of Solid-State Circuits, Dec. 1992, pp. 1697-1708, vol. 27, No. 10, IEEE.

HIGH SPEED TRACK AND HOLD CIRCUIT

CROSS-REFERENCES TO RELATED APPLICATIONS

The present application for patent is related to U.S. patent application Ser. No. 12/551,452, entitled "THERMOMETER CODE TRANSCODING METHODS AND SYSTEMS," filed on Aug. 31, 2009, issued as U.S. Pat. No. 8,022,854 on Sep. 20, 2011, assigned to the assignee hereof, and expressly incorporated by reference herein.

BACKGROUND

Analog-to-digital conversion (ADC) is often used to sample analog signals so that such signals may be digitally represented. The need for digital representation of analog signals arises in a variety of applications such as digital communication receivers.

A variety of techniques to perform ADC are well known in the art. Two common techniques include the successive approximation (SA) ADC and the flash ADC. An SA ADC circuit generally produces a digital representation by processing an input analog signal through successive stages, each stage comprising a comparator configured to get a successively more accurate digital representation of the input analog signal. In a typical flash ADC circuit, an input analog signal value is compared with various reference levels, all at once, using multiple comparators. All other things being equal, because a flash ADC circuit has a single stage of comparators instead of multiple stages of comparators as in an SA ADC circuit, a flash ADC circuit may typically produce a digital representation of an analog input signal with lower latency than an SA ADC circuit. Therefore, the flash ADC technique is generally considered more suitable for a high speed application.

With the increasing demand for high data rates and constellation densities, especially in signals transmitted in the Giga Hertz (GHz) range, the demand for fast, accurate high speed ADC is ever increasing. When using a flash ADC circuit, this in turn requires each stage of the flash ADC circuit, such as a track and hold (T/H) stage, to be implemented using an accurate, high speed circuit.

In one aspect of the disclosure, a better T/H circuit is needed to meet the increased speed and accuracy requirements.

SUMMARY

In an aspect of the disclosure, a track-and-hold circuit may comprise one or more of the following: an input amplifier circuit configured to produce a pair of differential voltage outputs responsive to a pair of differential voltage inputs, the input amplifier comprising a pair of bipolar junction transistors in a common emitter configuration, a switching circuit configured, in response to a clock signal, to couple the input amplifier circuit to an output circuit or to decouple the input amplifier circuit from the output circuit, a grounding circuit configured to couple the input amplifier to an electrical ground, and the output circuit configured to track values of the pair of differential voltage outputs when the switching circuit is in a closed position and to hold the values of the pair of differential voltage outputs constant when the switching circuit is in an open position.

In another aspect of the disclosure, a method may be provided for tracking-and-holding an analog input signal. The method may comprise one or more of the following: operating an input amplifier circuit to provide an output signal responsive to the analog input signal, the input amplifier circuit comprising a pair of bipolar junction transistors (BJTs), operating a switching circuit, in response to a control signal, to couple the input amplifier circuit to an output circuit in a first phase of the control signal or to isolate the input amplifier circuit from the output circuit in a second phase of the control signal, operating the output circuit to track a value of the output signal in the first phase of the control signal and to hold the value of the output signal in the second phase of the control signal, and operating a grounding circuit to couple the input amplifier circuit to an electrical ground.

In yet another aspect of the disclosure, a track-and-hold circuit may comprise one or more of the following: an input amplifier circuit configured to provide an output signal responsive to an input signal, the input amplifier circuit comprising one or more transistors in a common emitter configuration, a switching circuit configured, in response to a control signal, to couple the input amplifier circuit to an output circuit in a first mode or to isolate the input amplifier circuit from the output circuit in a second mode, the output circuit configured to track a value of the output signal when the switching circuit is in a first mode and to hold the value of the output signal when the switching circuit is in a second mode, and a grounding circuit coupled between the input amplifier circuit and an electrical ground.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known circuit elements and components are shown in block diagram form in order to avoid obscuring the concepts of the subject technology. Like components are labeled with identical element numbers for ease of understanding.

Analog-to-digital conversion (ADC) processing is used in a variety of applications including digital communication systems and digital signal and image processing systems. One approach to ADC, particularly when high data rates are involved, may be referred to as a flash ADC. In a typical flash ADC system, an input analog signal is sampled and the amplitude of the sampled signal is compared with multiple digital reference signals, typically all at once, to generate a digital representation. A track-and-hold (T/H) circuit is typically used to hold the sampled input analog signal at a constant value during the comparison operation.

In practice, semiconductor implementation of a T/H circuit may require a trade-off between accuracy and speed. Broadly speaking, T/H circuits implemented using bipolar junction transistor (BJT) technology generally exhibit better high-speed performance in comparison to T/H circuits implemented using Metal Oxide Semiconductor (MOS) or Metal Oxide Semiconductor Field Effect Transistor (MOSFET) technology, but are less accurate. One reason for the reduced accuracy may be the capacitive linkage between input and output blocks (e.g., Miller Effect). Another reason may be that because BJT transistors draw base current, the sampled voltage value may droop. A third reason may be that because T/H circuits using BJT transistors typically provide gain close to unity, such T/H circuits may not amplify the desired signal compared to unwanted noise and therefore are generally more susceptible to input noise.

Broadly and generally, in one aspect, the present disclosure provides a track-and-hold circuit comprising an input amplifier circuit, a switching circuit, a grounding circuit and an output circuit. The input amplifier circuit provides an output signal in response to an input signal. In one aspect, the input amplifier circuit is configured to have a relatively high isolation between the output signal and the input signal. In another aspect, the input amplifier circuit is configured to have a gain value, which is the ratio between the output signal value and the input signal value, greater than one. In another aspect, the input amplifier circuit is configured to have constant nominal input impedance (e.g., 50 Ohms). In certain configurations, the input amplifier circuit comprises a pair of bipolar junction transistors coupled in a common emitter configuration.

Broadly and generally, in one aspect, the switching circuit is configured to operate, responsive to a control signal (e.g., a signal derived from a clock signal used to clock the switching circuit), to facilitate operation of the input amplifier circuit in two modes: a first mode in which the input amplifier circuit is coupled to the output circuit and a second mode in which the input amplifier circuit is isolated from the output circuit. The output circuit is configured to track a value of the output signal when the switching circuit is in a first mode and to hold the value of the output signal when the switching circuit is in a second mode. In one aspect, the output circuit may be implemented using metal oxide semiconductor (MOS) technology that offers the advantage that, due to absence of a leakage current, a MOS transistor can be operated to hold a value of voltage at its gate to a relatively constant level.

Broadly and generally, in one aspect, a grounding circuit may be configured to couple an input amplifier circuit to an electrical ground. In certain configurations, the grounding circuit may be configured to control the gain value of the input circuit. In one aspect, the grounding circuit may be configured to control a bandwidth response of the input amplifier circuit.

In one aspect, the term "bipolar junction transistor (BJT)" may refer to any of a variety of multi-terminal transistors generally operating on the principal of carrying current using both electrons and holes, including but not limited to an n-p-n BJT, a p-n-p BJT, and a heterojunction BJT (HBT).

In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms "base," "emitter," and "collector" may refer to three terminals of a transistor and may refer to a base, an emitter and a collector of a bipolar junction transistor or may refer to a gate, a source, and a drain of a field effect transistor, respectively. In another aspect, the terms "gate," "source," and "drain" may refer to "base," "emitter," and "collector" of a transistor, respectively.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

Figure 1:
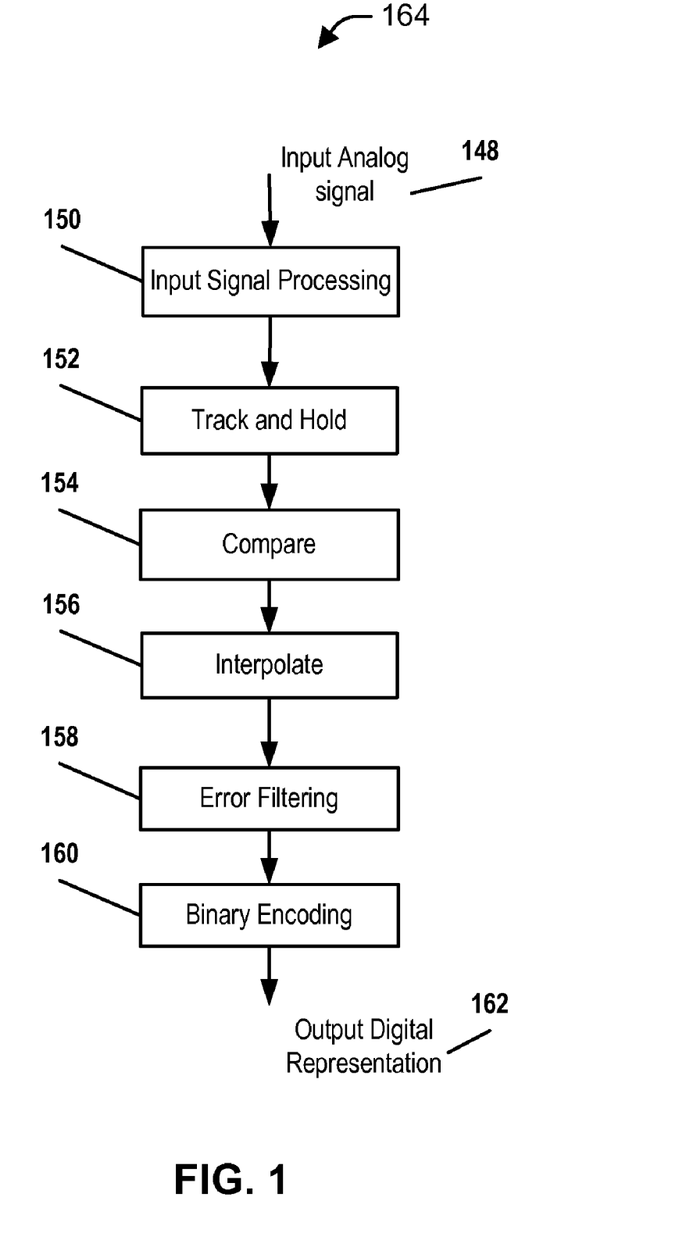
FIG. 1 is a functional block diagram of a flash analog-to-digital conversion circuit in accordance with certain configurations of the present disclosure.

FIG. 1 is a functional block diagram of a flash analog-to-digital conversion (ADC) circuit 164 in accordance with certain configurations of the present disclosure. A flash ADC circuit may be implemented to obtain, for example, a 6-bit digital representation of an OC-768 compliant analog signal comprising 38,486.016 Mbit/s data traffic in a communication receiver. The flash ADC circuit 164 converts an input analog signal 148 to an output digital representation 162. The input analog signal 148 is processed in an input signal processing block 150. The input signal processing block 150 may, for example, perform the task of matching impedance of the flash A/D circuit 164 to a previous block. The input signal processing block 150 may also generate multiple reference signals, using for example a resistive ladder. A track-and-hold (T/H) block 152 may sample the input analog signal 148 and hold the sampled value constant, as a sampled output signal, for a duration required for the subsequent processing. A compare block 154 may compare the sampled output signal output by the T/H block 152 to a plurality of reference signals (e.g., produced by the input signal processing block 150) to produce an estimate of the signal level for the input analog signal 148. In general, for a flash ADC circuit 164 designed to achieve N bits of digital representation, $2^N-1$ comparisons may be performed simultaneously. The resolution of the estimate may be improved by using an interpolation block 156 to interpolate signal values between two signal levels of the previous block. The result thus obtained may be filtered in an error filtering block 158 to remove errors of measurements. For example, the output of the interpolation may be represented in a digital code called thermometer code. The error filtering block 158 may operate to correct any bubble errors (which are sometimes referred to as sparkle errors) in the thermometer code. The resulting error-filtered signal is then binary coded in a binary encoding block 160 to produce the digital representation 162.

Figure 2A:
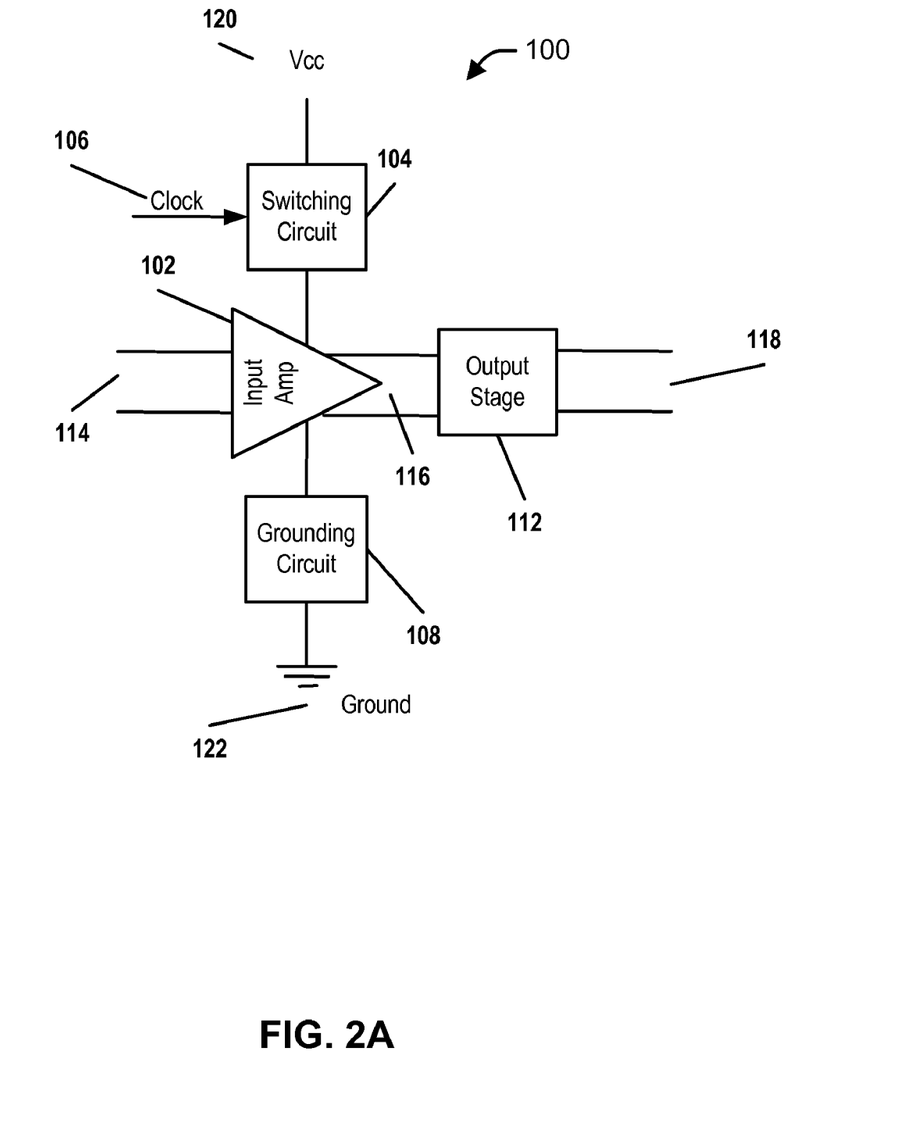
FIG. 2A is a block diagram of a track-and-hold circuit, in accordance with certain configurations of the present disclosure.

FIG. 2A is a block diagram of a track-and-hold (T/H) circuit 100, in accordance with certain configurations of the present disclosure. The T/H circuit 100 may be used, for example, at block 152 as described above. The T/H circuit 100 can be used to track an input analog signal, represented as a pair of differential inputs 114, to produce a pair of differential outputs 118. The T/H circuit 100 may comprise an input amplifier circuit 102 coupled to a power source Vcc 120 through a switching circuit 104. The switching circuit 104 may be configured to operate in at least two switching modes—a coupling mode and a decoupling mode. The couple/decouple operation of the switching circuit 104 may be responsive to a control signal such as a clock signal 106. The input amplifier 102 may also be coupled to an electrical ground 122 via a grounding circuit 108. An output block 112 may be fed with the two differential voltage output signals 116 of the input amplifier 102. The output block 112 may produce a pair of differential voltage outputs 118 representing a tracked and held value corresponding to the pair of differential input voltage signals 114. Broadly speaking, the output block 112 may be configured to track and hold the voltage value of the differential voltage 114 when the switch circuit 104 is in a closed position and hold the value of the voltage in a capacitive buffer when the switch circuit is in an open position.

Figure 2B:
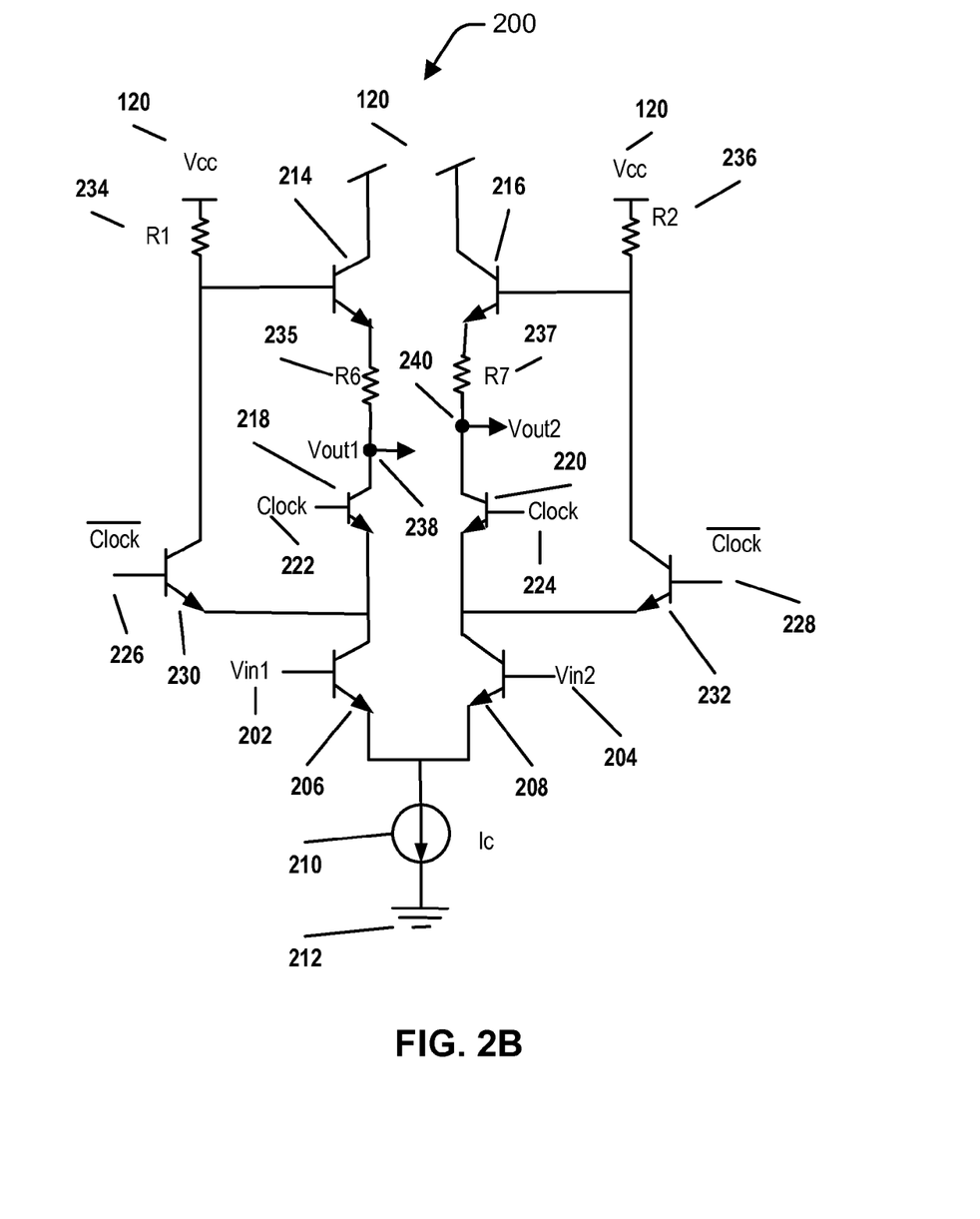
FIG. 2B is a circuit diagram of a track-and-hold circuit, in accordance with certain configurations of the present disclosure.

FIG. 2B is a circuit diagram of a track-and-hold circuit 200, in accordance with certain configurations of the present disclosure. In the illustrated circuit 200, the input analog differential voltage pair is represented by a signal Vin1 202 and Vin2 204. The signals 202, 204 are fed into bases of n-p-n (NPN) bipolar junction transistors (BJT) 206 and 208 respectively, the transistors 206 and 208 being electrically coupled to form a common emitter formation, acting as an input amplifier, and coupled to an electrical ground 212 through a current source Ic 210. The collector of transistor 206 is electrically coupled to the emitter of a transistor 214 (NPN BJT in the illustrated embodiment) through a switching transistor 218 and a collector resistor R6 235 and the collector of transistor 214 is electrically coupled to a voltage source Vcc 120. Similarly, the collector of transistor 208 is electrically coupled to the emitter of a transistor 216 (NPN BJT in the illustrated embodiment) through a switching transistor 220 and a collector resistor R7 237 and the collector of transistor 216 is electrically coupled to the voltage source Vcc 120.

Still referring to FIG. 2B, transistors 218 and 220 may act as switches, responsive to clock signals 222 and 224 respectively, that may be used to couple/decouple transistors 206, 208 from the power source Vcc 120. In the embodiment shown in FIG. 2B, transistor 218 is an NPN BJT. The clock signal 222 is applied to the base of transistor 218. Similarly, in the illustrated embodiment of FIG. 2B, transistor 220 is an NPN BJT. A clock signal 224 is applied to the base of transistor 220. In operation, clock signals 222 and 224 may be substantially identical, and both may be derived from the same clock signal 106.

Still referring to FIG. 2B, a first complementary clock signal $\overline{Clock}$ 226 controls a switching transistor 230 and a second complementary clock signal $\overline{Clock}$ 228 controls a switching transistor 232. In the illustrated embodiment, the transistors 230 and 232 are NPN BJT transistors, and each of the complementary clock signals $\overline{Clock}$ 226 and $\overline{Clock}$ 228 drives the base of the respective transistor. The switching transistors 230 and 232 couple collectors of the transistors 26 and 208 respectively to the voltage source Vcc 120 through resistors R1 234 and R2 236 respectively. The use of clock signals and complementary clock signals to turn on/off the switching transistors form a commutator circuit that turns on/off the input amplifier block 102 during high/low values of the clock. The switching transistors 230 and 232 are provided to enable amplifier operation of the circuit comprising transistors 206 and 208 when $\overline{Clock}$ 226 and $\overline{Clock}$ 228 are at a logical low (low voltage) value. Furthermore, when $\overline{Clock}$ 226 and $\overline{Clock}$ 228 are at a logical high (high voltage), the circuit comprising transistors 206 and 208 is "open" thereby isolating inputs Vin1 202 and Vin2 204 from the outputs Vout1 236 and Vout2 240.

In an illustrative operation, complementary clock signals $\overline{Clock}$ 226 and $\overline{Clock}$ 228 may be substantially identical and derived from the same source signal, typically by inverting the clock signal 106 (shown in FIG. 2A). During operation, when the clock signals 222 and 224 are at a logical high, the complementary clock signals $\overline{Clock}$ 226 and $\overline{Clock}$ 228 are at a logical low. During this time, the transistors 206 and 208 act as common emitter amplifiers, with the gain for the amplification block being responsive to the value of transconductance of transistors 206 and 208. Therefore, in the high phase of clock, when clock signals 222 and 224 are at a logical high, the switching circuit formed by transistors 218 and 220 is in a "closed" position, and the differential output signal (Vout1−Vout2) will be proportional to the differential input signal (Vin1−Vin2). On the other hand, in the low phase of the clock, when the clock signals 222 and 224 are at a logical low, the complementary clock signals 226 and 228 are at a logical high. During this time, the switching circuit formed by transistors 218 and 220 is in an "open" position. This results in electrical isolation of signals Vout1 238 and Vout2 240. The voltage levels Vout1 238 and Vout2 240 will "float" to their last value before the isolation, because of transistors 218 and 220 going to the "open" position.

Figure 2C:
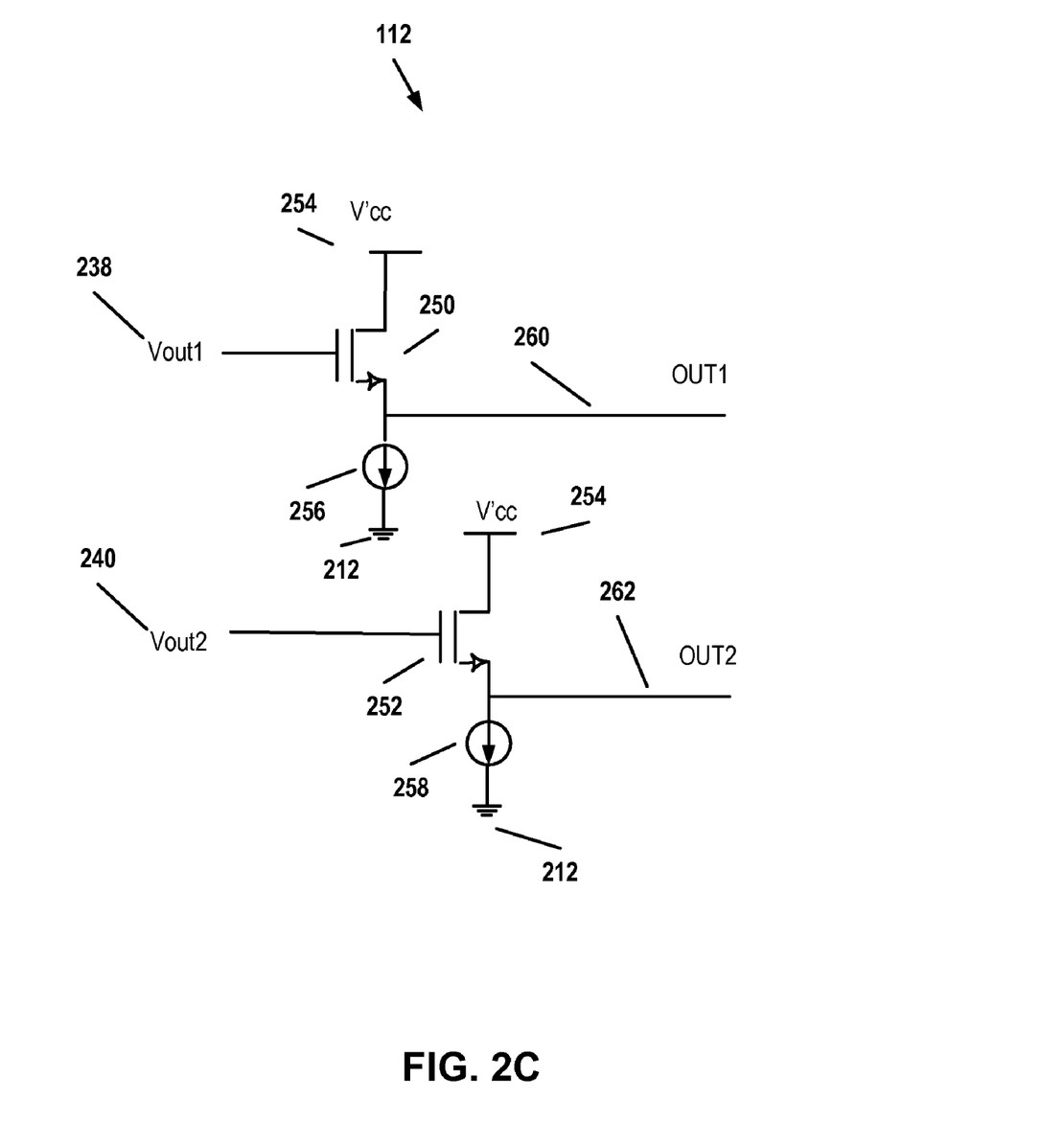
FIG. 2C is a block diagram of an output block of a track-and-hold circuit, in accordance with certain configurations of the present disclosure.

FIG. 2C is a block diagram of an output block of a T/H circuit 112, in accordance with certain configurations of the present disclosure. The output block 112 may be configured to act as a voltage buffer holding constant voltage values at its output, where the voltage values at the output are proportional to the voltage values at the input. In the configuration illustrated in FIG. 2C, two MOS transistors 250 and 252 are shown coupled in a source follower configuration, each having its drain electrically coupled to a voltage source V'cc 254 and its source coupled through a current source 256 or 258, respectively, to the electrical ground 212. Depending on the type of transistors used to implement the output amplifier block 112, the voltage source V'cc may provide a different voltage value than the voltage source Vcc 120. One output Vout1 238 of the pair of differential voltage outputs is coupled to the gate of one of the pair of MOS transistors (transistor 250) and the other output Vout2 240 of the pair of differential voltage outputs is coupled to the gate of the other MOS transistor 252 from the pair of MOS transistors. Outputs of the sources are tapped off as outputs of the output block circuit 112, shown as OUT1 260 and OUT2 262 in FIG. 2C.

In operation, when the clock signals 222 and 224 are at a logical high in the operation described with respect to FIG. 2B, voltage values of the signals Vout1 238 and Vout2 240 change responsive to the input values Vin1 202 and Vout 204, respectively. When the clock signals 222 and 224 are at logical low, voltages Vout1 238 and Vout2 240 will be held to a constant value because the input block circuit 200 is "open" causing the signal levels to "float" to their last values, as described before. In one aspect, the term "constant" may refer to substantially constant. Furthermore, because there is no base current leakage for MOSFET transistors, there is an insignificant change in the voltage values at the base of the MOSFET transistors 250 and 252 of the output block 112 during the low phase of the clock. The output block 112 as described above thus tracks values of the pair of differential voltage outputs 116 when the switching circuit 104 is in a closed position and hold the values of the pair of differential voltage outputs 116 in a capacitive buffer when the switching circuit 104 is in an open position.

Figure 3:
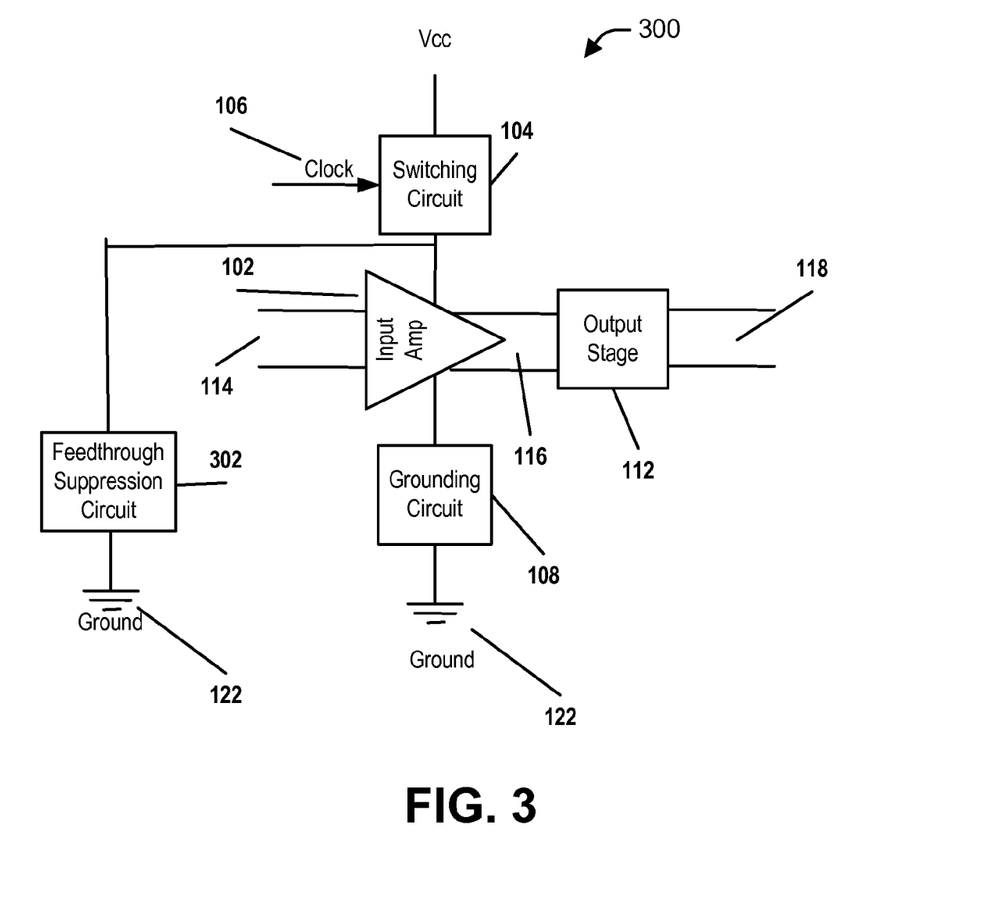
FIG. 3 is a block diagram of a track-and-hold circuit with a feedthrough suppression circuit, in accordance with certain configurations of the present disclosure.

FIG. 3 is a block diagram of a T/H circuit 300, that is a variation of the T/H circuit 100, with a feedthrough suppression circuit 302 added, in accordance with certain configurations of the present disclosure. As used herein, in one aspect, "feedthrough" may refer to fluctuations in voltage levels at the output of an amplifier, caused due to harmonics of a clock signal. The feedthrough suppression circuit 302 is configured to attenuate higher order harmonics of the clock signal 106, in order to reduce the effect of clock signals feeding through the amplifier 102, to the output 116 of the amplifier 102. The feedthrough suppression circuit 302 is configured to couple the pair of differential voltage outputs 116 to the electrical ground 212 via a frequency selective circuit.

Figure 4:
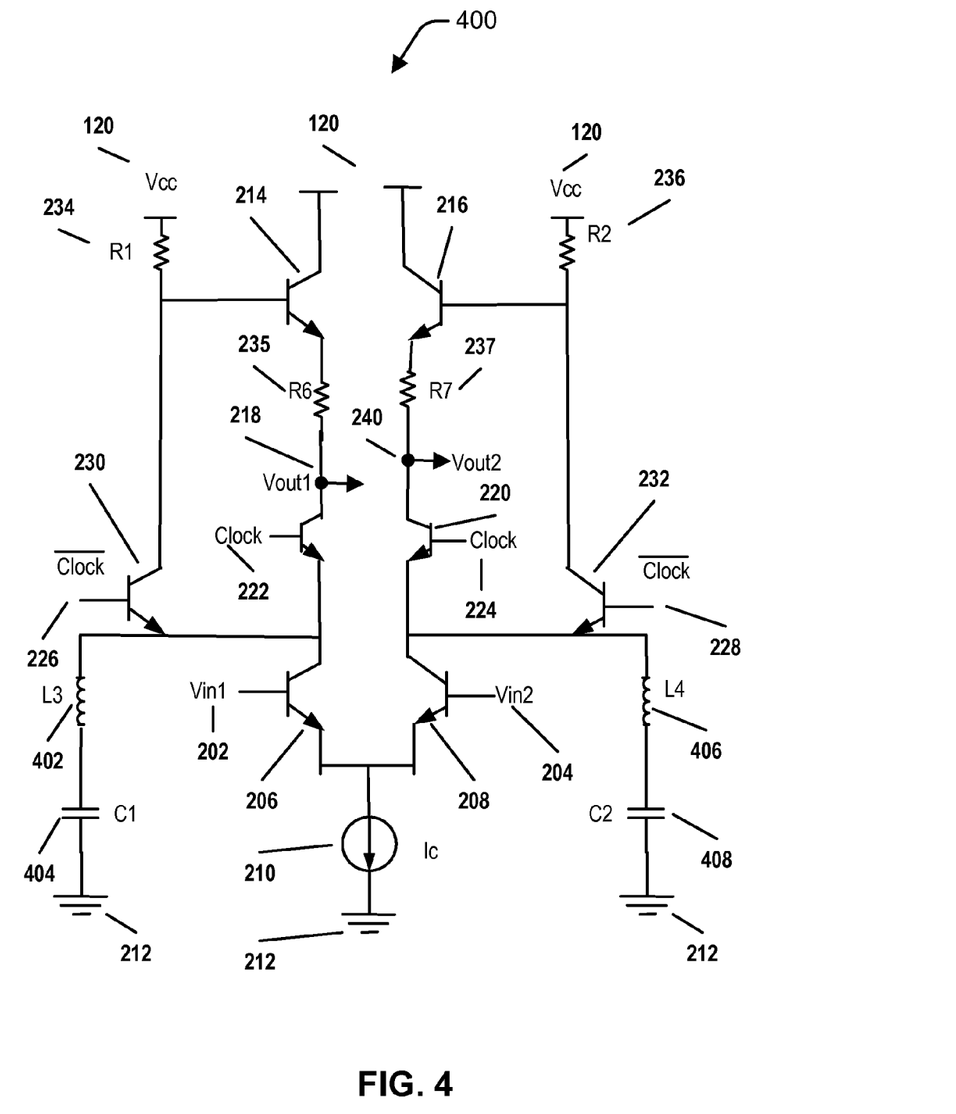
FIG. 4 is a circuit diagram of a track-and-hold circuit with a feedthrough suppression circuit, in accordance with certain configurations of the present disclosure.

FIG. 4 is a circuit diagram of a track-and-hold circuit 400 in which the feedthrough suppression circuit 302 is implemented with passive elements. An inductor L3 402 and a capacitor C1 404 are coupled to each other in series between the collector of the transistor 206 forming the common emitter amplifier and the electrical ground 212. Similarly, an inductor L4 406 and a capacitor C2 408 are coupled in series between collector of the transistor 208 forming the common emitter amplifier and the electrical ground 212. One skilled in the art will appreciate that the values of inductors L3 402 and L4 406 and capacitors C1 404 and C2 408 can be selected such that the LC product of the circuit effectively shorts the transistors 206 and 208 to ground at a selected harmonics of the clock frequency. In certain configurations, the feedthrough suppression circuit 302 may comprise of multiple inductive and capacitive component pairs, with the LC value of each pair selected to suppress one harmonic of the clock frequency such that the feedthrough suppression circuit 302 acts to short to the electrical ground 212 at the selected multiple harmonics (e.g., first and second harmonics) of the clock frequency.

Figure 5:
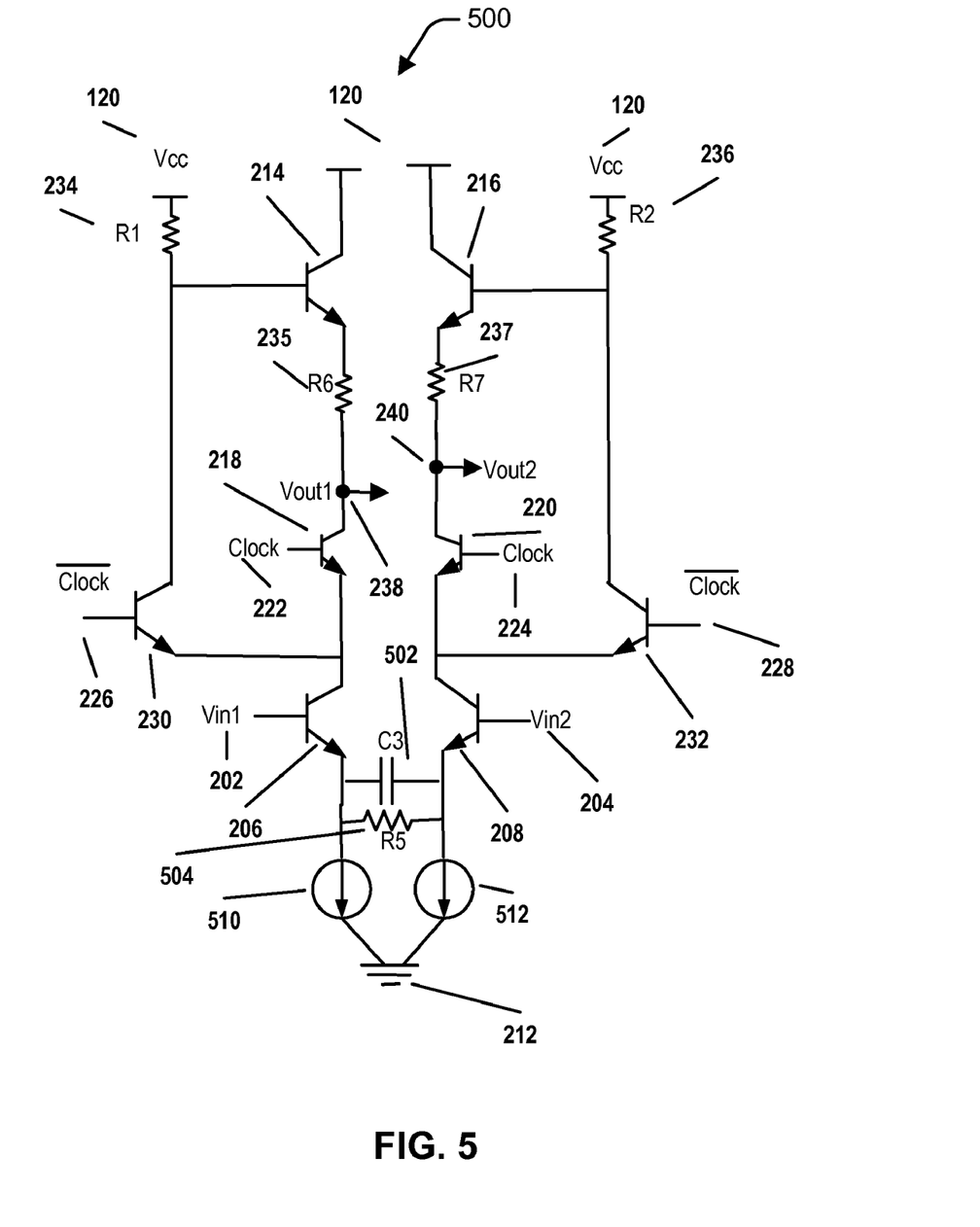
FIG. 5 is a circuit diagram of a track-and-hold circuit including a gain adjustment circuit and a bandwidth enhancement circuit, in accordance with certain configurations of the present disclosure.

FIG. 5 is a block diagram of a T/H circuit 500 that includes a gain adjustment circuit and a bandwidth enhancement circuit included in the grounding circuit 108, as further explained below. The common emitter configuration of transistors 206 and 208 shown in FIG. 2B is altered so that the emitter terminal of transistor 206 is coupled to the electrical ground 212 through a current source 510 and the emitter terminal of transistor 208 is coupled to the electrical ground 212 through a current source 512. A resistor R5 504 and a capacitor C3 502 are coupled in parallel between emitters of transistors 206 and 208. One skilled in the art will appreciate that by coupling the transistors 206 and 208 to electrical ground 212 through a frequency-sensitive circuit, such as the RC circuit described above, both gain and bandwidth of operation for the T/H circuit 500 can be adjusted by adjusting values of components of the frequency-sensitive circuit.

Certain embodiments of the T/H circuit 500 may operate without the capacitor C3 502 (i.e., value of C3 being infinite). When operating without the capacitor C3 502, the gain of the input amplifier 102 may be proportional to the ratios R6/R5 and R7/R5, representing ratios of collector resistor over emitter resistor. An implementer can thus implement a T/H circuit 500 with a desired gain value by choosing appropriate values of R5, R6 and R7 in an implementation. The ratio between the voltage value at the output differential voltage pair 238 and 240 and the voltage value at the input differential voltage pair 202 and 204 will be responsive to the gain value. When the capacitor C3 502 is present, the effective value of the emitter resistor reduces as the frequency of operation goes up (due to the presence of a capacitor in parallel). Therefore, the frequency response of the T/H circuit 500 can be effectively improved at higher frequencies by increasing the gain of the input amplifier 102. Practitioners of the art will recognize that the gain and the frequency response of the T/H circuit 500 can be controlled independent of each other by choosing suitable values of C3 502 and R5 504.

While FIG. 5 illustrates one example of a grounding circuit utilizing a capacitor and a resistor, in some configurations (e.g., FIGS. 2B and 4), a grounding circuit may simply represent a connection(s) (e.g., one or more wires). These are merely examples, and the subject technology is not limited to these examples.

It will be appreciated that the various configurations of T/H circuits described with respect to FIGS. 2A through 5 have several operational advantages in a flash ADC application. For example, because input voltages Vin1 202 and Vin2 204 are applied to the base terminal of the input transistors 206 and 208 that are in a common emitter configuration, the resulting input amplifier circuit 102 can be chosen to provide a gain value greater than 1. Because this gain amplifies the input analog signal, the gain effectively helps reduce relative effects of noise generated beyond the T/H circuit with respect to the input analog signal value. Furthermore, the use of a common emitter configuration for the input amplifier 102 significantly reduces the offset voltage problem faced by conventional ADC circuits.

Another operational advantage offered by certain configurations of the present invention is that because of a relatively small number of transistors required to implement the input amplifier 102 and the switching circuit 104, the track-and-hold function can be implemented using close-to-identical transistors, thereby eliminating output voltage errors caused by the mismatched geometries of various transistor components during fabrication. For example, an input amplifier may be implemented with no more than 2 transistors, and a switching circuit may be implemented with no more than 6 transistors.

In certain configurations of the present disclosure, the switching circuit 104 may be configured to additionally increase the bandwidth of operation of the T/H circuit 100, as discussed below. In the circuit illustrated in FIG. 5, transistors 214 and 216 may be operating in an "emitter follower" type configuration. It is well-known that an emitter follower can be operated to exhibit inductive properties (i.e., the impedance of the emitter follower may increase with increasing frequency) when operated with transistors having sufficiently high transconductance values. Therefore, in one aspect, emitter widths of transistors 214 and 216 may be chosen to be sufficiently large so that the transistors 214 and 216 may operate in an inductive manner thereby causing the switching circuit 104 to behave as a gyrator with negative impedance. Because transistors 214 and 216 couple voltage source 120 to the outputs Vout1 238 and Vout2 240, inductive operation of the transistors 214 and 216 may result in higher frequency response at the outputs Vout1 238 and Vout2 240, thereby resulting in increased bandwidth of operation of the T/H circuit 100. The increased emitter width of transistors 214 and 216 may further benefit operation of the T/H circuit 100 by reducing intermodulation distortion at the output of the emitters of transistors 214 and 216, as is well known in the art.

In one aspect, the presence of a resistors R6 235 and R7 237 advantageously helps attenuate clock feedthrough, thereby further improving accuracy of the output voltage values Vout1 238 and Vout2 240. In another aspect, because the input amplifier 102 is implemented using common emitter formation of BJT transistors 206 and 208, by choosing appropriate values of the various resistors in the circuit 500, the T/H circuit 500 can be optimized to present desired impedance to the circuitry feeding the input analog signals 114 to the T/H circuit 500. Furthermore, values of the resistors R1 234, R2 236, R6 235 and R7 237 can be chosen such that the impedance of the T/H circuit 100 is held to the same value during both high and low phases of the clock. In one aspect, an input amplifier circuit may include at least one transistor in a common emitter configuration.

The subject technology is illustrated, for example, according to various aspects described below. Numbered clauses are provided below for convenience. These are provided as examples, and do not limit the subject technology.

Figure 6A:
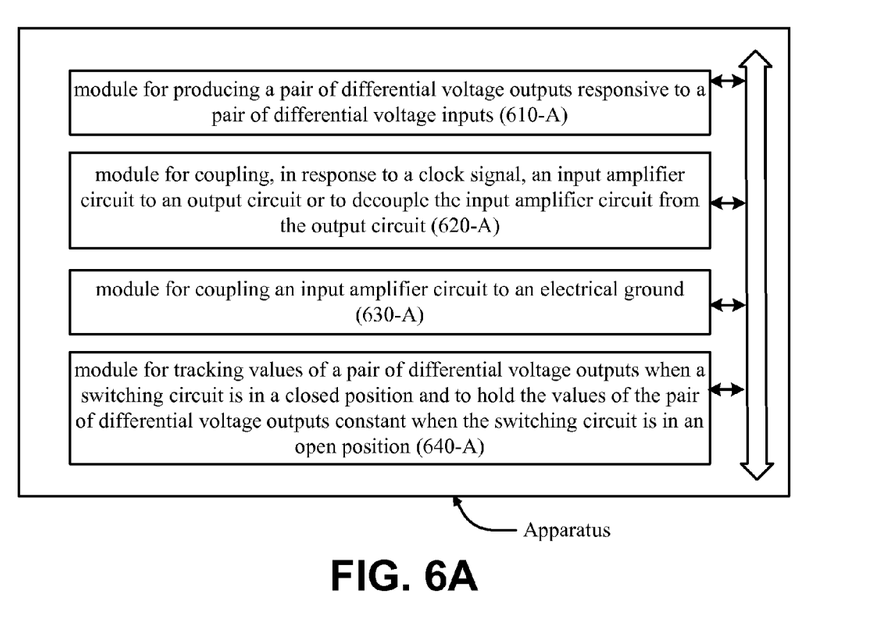
FIG. 6A is a flow chart illustrating an example of a method for tracking-and-holding an input signal, in accordance with certain configurations of the present disclosure.

1. A track-and-hold circuit comprising:
an input amplifier circuit configured to produce a pair of differential voltage outputs responsive to a pair of differential voltage inputs, the input amplifier comprising a pair of bipolar junction transistors in a common emitter configuration (e.g., 610-A of FIG. 6A);
a switching circuit configured, in response to a clock signal, to couple the input amplifier circuit to an output circuit or to decouple the input amplifier circuit from the output circuit (e.g., 620-A of FIG. 6A);
a grounding circuit configured to couple the input amplifier to an electrical ground (e.g., 630-A of FIG. 6A); and
the output circuit configured to track values of the pair of differential voltage outputs when the switching circuit is in a closed position and to hold the values of the pair of differential voltage outputs constant when the switching circuit is in an open position (e.g., 640-A of FIG. 6A).

2. The track-and-hold circuit of clause 1, wherein the input amplifier circuit comprises a current source coupled between emitters of the pair of bipolar junction transistors and the electrical ground.

3. The track-and-hold circuit of clause 1, wherein
the output circuit comprises a pair of metal oxide silicon (MOS) transistors configured to operate in a source follower configuration; and
a first output of the input amplifier circuit is coupled to a gate of one of the pair of MOS transistors, and a second output of the input amplifier circuit is coupled to a gate of the other MOS transistor of the pair of MOS transistors.

4. The track-and-hold circuit of clause 1, further comprising a clock feedthrough suppression circuit coupled to the switching circuit, the clock feedthrough suppression circuit configured to suppress harmonics of the clock signal.

5. The track-and-hold circuit of clause 1, further comprising a clock feedthrough suppression circuit comprising a frequency selective circuit, the clock feedthrough suppression circuit coupled between the switching circuit and the electrical ground.

6. The track-and-hold circuit of clause 5, wherein the frequency selective circuit comprises an inductor and a capacitor coupled in series.

7. The track-and-hold circuit of clause 1, wherein the grounding circuit comprises a gain adjustment circuit, and wherein the ratio between the values of the pair of differential voltage outputs and the pair of differential voltage inputs is responsive to a gain value of the gain adjustment circuit.

8. The track-and-hold circuit of clause 1, wherein the grounding circuit comprises a bandwidth enhancement circuit configured to control a frequency response of the track-and-hold circuit.

9. The track-and-hold circuit of clause 1, wherein the grounding circuit comprises a capacitor and a resistor formed in parallel and coupled between emitters of input transistors of the input amplifier circuit.

10. The track-and-hold circuit of clause 1, wherein
the pair of bipolar junction transistors comprises a first bipolar junction transistor (BJT) and a second BJT;
the switching circuit comprises a third BJT and a fourth BJT; and
the output circuit comprises a first metal oxide semiconductor (MOS) transistor and a second MOS transistor;
the emitter of the first BJT is coupled to the emitter of the second BJT;
the gate of the first BJT is coupled to one input of the pair of differential voltage inputs, and the gate of the second BJT is coupled to the other input of the pair of differential voltage inputs;
the collector of the first BJT is coupled to the emitter of the third BJT, and the collector of the second BJT is coupled to the emitter of the fourth BJT;
the collectors of the third and the fourth BJT are coupled to a power supply; and
the base of the third BJT is coupled to the collector of the first BJT, and the base of the fourth BJT is coupled to the collector of the second BJT.

11. The track-and-hold circuit of clause 10, wherein the switching circuit further comprises a fifth, a sixth, a seventh and an eighth BJT; wherein
the bases of the fifth and the sixth BJTs are coupled to the clock signal;
the collector of the fifth BJT is coupled to one output of the pair of differential voltage outputs and the collector of the sixth BJT is coupled to the other output of the pair of differential voltage outputs;
the bases of the seventh and the eighth BJT are coupled to a complementary clock signal;
the emitter of the seventh BJT is coupled to the collector of the first BJT and the emitter of the eighth BJT is coupled to the collector of the second BJT;
the collector of the seventh BJT is coupled to the base of the third BJT and the collector of the eighth BJT is coupled to the base of the fourth BJT;
the emitter of the fifth BJT is coupled to the collector of the first BJT and the emitter of the sixth BJT is coupled to the collector of the second BJT;
a first resistor is coupled between the emitter of the third BJT and the collector of the fifth BJT and a second resistor is coupled between the emitter of the fourth BJT and the collector of the sixth BJT; and
a third resistor is coupled between the voltage source and the base of the fifth BJT and a fourth resistor is coupled between the voltage source and the base of the sixth BJT.

12. The track-and-hold circuit of clause 11, further comprising
a first inductor and a first capacitor coupled in series between the collector of the first BJT and the electrical ground; and
a second inductor and a second capacitor coupled in series between the collector of the second BJT and the electrical ground.

13. The track-and-hold circuit of clause 10, further comprising
a resistor and a capacitor coupled in parallel and further coupling the emitter of the first BJT with the emitter of the second BJT;
a first current source coupling the emitter of the first BJT to the electrical ground; and
a second current source coupling the emitter of the second BJT to the electrical ground.

14. The track-and-hold circuit of clause 1, wherein a flash analog-to-digital conversion (ADC) circuit comprises an input signal processing circuit, the track-and-hold circuit and a compare circuit, wherein the input signal processing circuit is configured to receive an analog signal input and to produce the pair of differential input voltage inputs, and wherein the compare circuit is configured to receive a sampled output signal from the track-and-hold circuit.

15. The track-and-hold circuit of any of clauses 1-14, wherein a transmitter comprises the track-and-hold circuit.

16. The track-and-hold circuit of any of clauses 1-14, wherein a receiver comprises the track-and-hold circuit.

17. The track-and-hold circuit of any of clauses 1-14, wherein a transceiver comprises the track-and-hold circuit.

18. The track-and-hold circuit of any of clauses 1-14, wherein a flash analog-to-digital conversion (ADC) circuit comprises the track-and-hold circuit.

The subject technology is illustrated, for example, according to various aspects described below. Numbered clauses are provided below for convenience. These are provided as examples, and do not limit the subject technology.

Figure 6B:
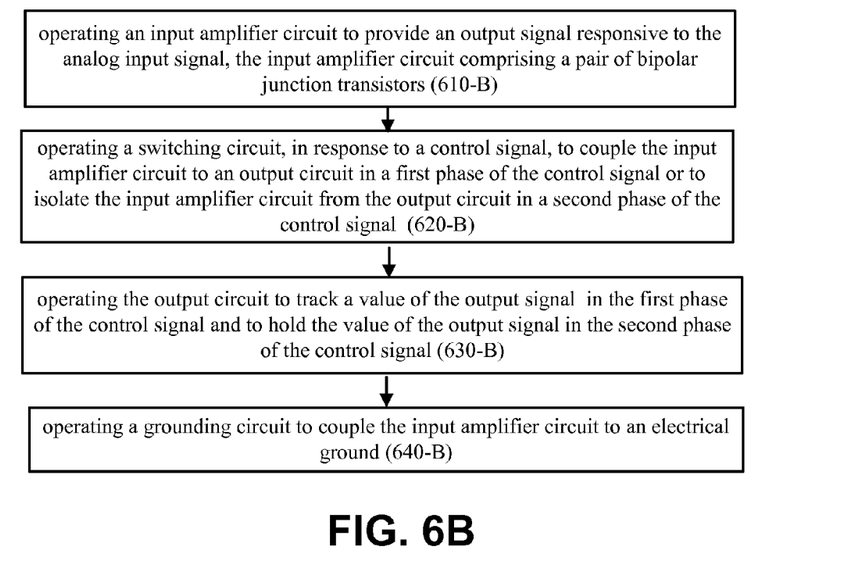
FIG. 6B is a block diagram of an example of an apparatus for tracking-and-holding an input signal, in accordance with certain configurations of the present disclosure.

1. A method of tracking-and-holding an analog input signal, comprising:
operating an input amplifier circuit to provide an output signal responsive to the analog input signal, the input amplifier circuit comprising a pair of bipolar junction transistors (BJTs) (e.g., 610-B of FIG. 6B);
operating a switching circuit, in response to a control signal, to couple the input amplifier circuit to an output circuit in a first phase of the control signal or to isolate the input amplifier circuit from the output circuit in a second phase of the control signal (e.g., 620-B of FIG. 6B);
operating the output circuit to track a value of the output signal in the first phase of the control signal and to hold the value of the output signal in the second phase of the control signal (e.g., 630-B of FIG. 6B); and
operating a grounding circuit to couple the input amplifier circuit to an electrical ground (e.g., 640-B of FIG. 6B).

2. The method of clause 1, further comprising:
operating a clock feedthrough suppression circuit coupled to the switching circuit, the clock feedthrough suppression circuit configured to suppress harmonics of the control signal.

3. The method of clause 1, wherein the operation of the grounding circuit comprises operating a gain adjustment circuit, wherein the ratio between a value of the output signal and a corresponding value of the input signal is responsive to a gain value of the gain adjustment circuit.

4. The method of clause 1, wherein the operation of the grounding circuit comprises operating a bandwidth enhancement circuit to control a frequency response of the input amplifier circuit, the bandwidth enhancement circuit comprising a capacitor and a resistor.

5. An apparatus for tracking-and-holding an analog input signal, comprising:
means for producing a pair of differential voltage outputs responsive to a pair of differential voltage inputs (e.g., 610-A of FIG. 6A);
means for coupling, in response to a control signal, an input amplifier circuit to an output circuit or to decouple the input amplifier circuit from the output circuit (e.g., 620-A of FIG. 6A);
means for coupling an input amplifier circuit to an electrical ground (e.g., 630-A of FIG. 6A); and
means for tracking values of a pair of differential voltage outputs when a switching circuit is in a closed position and to hold the values of the pair of differential voltage outputs constant when the switching circuit is in an open position (640-A of FIG. 6A).

6. The apparatus of clause 5, further comprising:
means for suppressing harmonics of the control signal.

7. The apparatus of clause 5, further comprising:
means for adjusting a gain value, wherein the ratio between a value of the output signal and a corresponding value of the input signal is responsive to the gain value.

8. The apparatus of clause 5 further comprising:
means for controlling a frequency response of the input amplifier circuit.

The subject technology is illustrated, for example, according to various aspects described below. Numbered clauses are provided below for convenience. These are provided as examples, and do not limit the subject technology.

Figure 7:
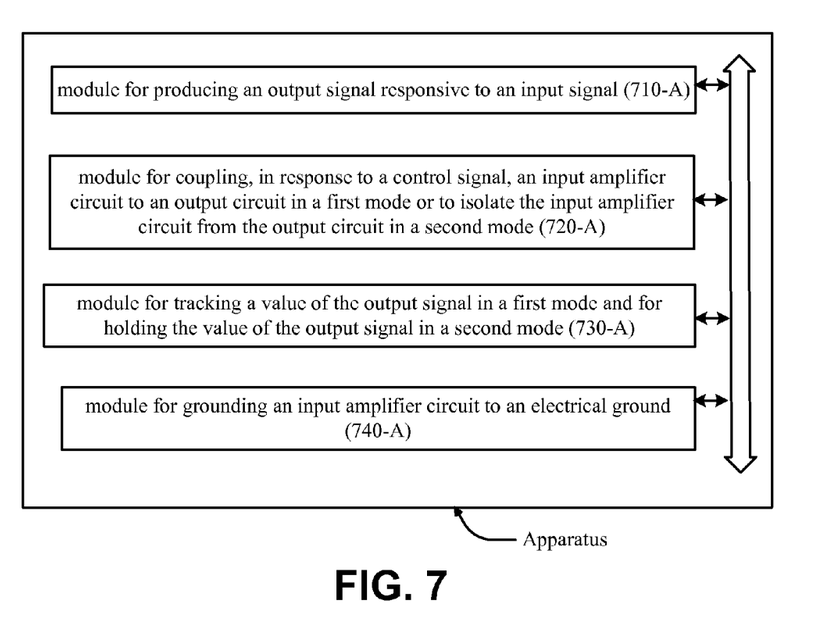
FIG. 7 is a block diagram of another example of an apparatus for tracking-and-holding an input signal, in accordance with certain configurations of the present disclosure.

1. A track-and-hold circuit comprising:
an input amplifier circuit configured to provide an output signal responsive to an input signal, the input amplifier circuit comprising one or more transistors in a common emitter configuration (e.g., 710-A of FIG. 7);
a switching circuit configured, in response to a control signal, to couple the input amplifier circuit to an output circuit in a first mode or to isolate the input amplifier circuit from the output circuit in a second mode (e.g., 720-A of FIG. 7);
the output circuit configured to track a value of the output signal when the switching circuit is in a first mode and to hold the value of the output signal when the switching circuit is in a second mode (e.g., 730-A of FIG. 7); and
a grounding circuit coupled between the input amplifier circuit and an electrical ground (e.g., 740-A of FIG. 7).

2. The track-and-hold circuit of clause 1, wherein the one or more transistors are a pair of bipolar junction transistors, and wherein the output circuit comprises a pair of metal oxide semiconductor (MOS) transistors configured in an emitter follower configuration.

The subject technology has been described with particular illustrative configurations. It is to be understood that the subject technology is not limited to the above-described configurations and that various changes and modifications may be made by those of ordinary skill in the art without departing from the scope if the subject technology. For example, various configurations have been described with reference to bipolar complementary metal oxide semiconductor (BiCMOS) implementations using n-p-n bipolar junction transistors (BJT) and metal oxide semiconductor field effect transistor (MOSFET) transistors. Practitioners of the art will recognize that several variations are possible by using different transistor configurations and substrates for implementation. Furthermore, while various configurations have been described with reference to pairs of differential voltage signals (e.g., a pair of differential voltage inputs 114, a pair of differential voltage outputs 116), other configurations within the scope of the subject technology may use non-differential signals (e.g., single-ended configurations).

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

In one aspect, the term "coupled" or the like may refer to being directly coupled. In another aspect, the term "coupled" or the like may refer to being indirectly coupled. In one aspect, a transistor may refer to a bipolar junction transistor, a field effect transistor, or the like.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A track-and-hold circuit comprising:
an input amplifier circuit configured to produce a pair of differential voltage outputs responsive to a pair of differential voltage inputs, the input amplifier circuit comprising a pair of bipolar junction transistors in a common emitter configuration;
a switching circuit configured, in response to a clock signal, to couple the input amplifier circuit to an output circuit or to decouple the input amplifier circuit from the output circuit;
a grounding circuit configured to couple the input amplifier circuit to an electrical ground; and
the output circuit configured to track values of the pair of differential voltage outputs when the switching circuit is in a closed position and to hold the values of the pair of differential voltage outputs constant when the switching circuit is in an open position,
wherein:
the pair of bipolar junction transistors (BJTs) comprises a first BJT and a second BJT;
the switching circuit comprises a third BJT, a fourth BJT, a fifth BJT, a sixth BJT, a seventh BJT and an eighth BJT;
the emitter of the first BJT is coupled to the emitter of the second BJT;
the gate of the first BJT is coupled to one input of the pair of differential voltage inputs, and the gate of the second BJT is coupled to the other input of the pair of differential voltage inputs;
the collector of the first BJT is coupled to the emitter of the third BJT, and the collector of the second BJT is coupled to the emitter of the fourth BJT;
the collectors of the third and the fourth BJTs are coupled to a power supply;
the base of the third BJT is coupled to the collector of the first BJT, and the base of the fourth BJT is coupled to the collector of the second BJT;
the bases of the fifth and the sixth BJTs are coupled to the clock signal;
the collector of the fifth BJT is coupled to one output of the pair of differential voltage outputs and the collector of the sixth BJT is coupled to the other output of the pair of differential voltage outputs;
the bases of the seventh and the eighth BJTs are coupled to a complementary clock signal;
the emitter of the seventh BJT is coupled to the collector of the first BJT, and the emitter of the eighth BJT is coupled to the collector of the second BJT;
the collector of the seventh BJT is coupled to the base of the third BJT, and the collector of the eighth BJT is coupled to the base of the fourth BJT; and
the emitter of the fifth BJT is coupled to the collector of the first BJT, and the emitter of the sixth BJT is coupled to the collector of the second BJT.

2. The track-and-hold circuit of claim 1, wherein the input amplifier circuit comprises a current source coupled between emitters of the pair of bipolar junction transistors and the electrical ground.

3. The track-and-hold circuit of claim 1, wherein
the output circuit comprises a pair of metal oxide silicon (MOS) transistors configured to operate in a source follower configuration; and
a first output of the input amplifier circuit is coupled to a gate of one of the pair of MOS transistors, and a second output of the input amplifier circuit is coupled to a gate of the other MOS transistor of the pair of MOS transistors.

4. The track-and-hold circuit of claim 1, further comprising a clock feedthrough suppression circuit coupled to the switching circuit, the clock feedthrough suppression circuit configured to suppress harmonics of the clock signal.

5. The track-and-hold circuit of claim 1, further comprising a clock feedthrough suppression circuit comprising a frequency selective circuit, the clock feedthrough suppression circuit coupled between the switching circuit and the electrical ground.

6. The track-and-hold circuit of claim 5, wherein the frequency selective circuit comprises an inductor and a capacitor coupled in series.

7. The track-and-hold circuit of claim 1, wherein the grounding circuit comprises a gain adjustment circuit, and wherein the ratio between the values of the pair of differential voltage outputs and the pair of differential voltage inputs is responsive to a gain value of the gain adjustment circuit.

8. The track-and-hold circuit of claim 1, wherein the grounding circuit comprises a bandwidth enhancement circuit configured to control a frequency response of the track-and-hold circuit.

9. The track-and-hold circuit of claim 1, wherein the grounding circuit comprises a capacitor and a resistor formed in parallel and coupled between emitters of input transistors of the input amplifier circuit.

10. The track-and-hold circuit of claim 1, wherein
the output circuit comprises a first metal oxide semiconductor (MOS) transistor and a second MOS transistor.

11. The track-and-hold circuit of claim 10, wherein
a first resistor is coupled between the emitter of the third BJT and the collector of the fifth BJT and a second resistor is coupled between the emitter of the fourth BJT and the collector of the sixth BJT; and
a third resistor is coupled between the voltage source and the base of the fifth BJT and a fourth resistor is coupled between the voltage source and the base of the sixth BJT.

12. The track-and-hold circuit of claim 11, further comprising
a first inductor and a first capacitor coupled in series between the collector of the first BJT and the electrical ground; and
a second inductor and a second capacitor coupled in series between the collector of the second BJT and the electrical ground.

13. The track-and-hold circuit of claim 10, further comprising
a resistor and a capacitor coupled in parallel and further coupling the emitter of the first BJT with the emitter of the second BJT;
a first current source coupling the emitter of the first BJT to the electrical ground; and
a second current source coupling the emitter of the second BJT to the electrical ground.

14. The track-and-hold circuit of claim 1, wherein a flash analog-to-digital conversion (ADC) circuit comprises an input signal processing circuit, the track-and-hold circuit and a compare circuit, wherein the input signal processing circuit is configured to receive an analog signal input and to produce the pair of differential input voltage inputs, and wherein the compare circuit is configured to receive a sampled output signal from the track-and-hold circuit.

15. A method of tracking-and-holding an analog input signal, comprising:
operating an input amplifier circuit to provide an output signal responsive to the analog input signal, the input amplifier circuit comprising a pair of bipolar junction transistors (BJTs);
operating a switching circuit, in response to a control signal, to couple the input amplifier circuit to an output circuit in a first phase of the control signal or to isolate the input amplifier circuit from the output circuit in a second phase of the control signal;
operating the output circuit to track a value of the output signal in the first phase of the control signal and to hold the value of the output signal in the second phase of the control signal; and
operating a grounding circuit to couple the input amplifier circuit to an electrical ground,
wherein:
the pair of bipolar junction transistors comprises a first BJT and a second BJT;
the switching circuit comprises a third BJT, a fourth BJT, a fifth BJT, a sixth BJT, a seventh BJT and an eighth BJT;
the emitter of the first BJT is coupled to the emitter of the second BJT;
the gate of the first BJT is coupled to one input of the analog input signal, and the gate of the second BJT is coupled to the other input of the analog input signal;
the collector of the first BJT is coupled to the emitter of the third BJT, and the collector of the second BJT is coupled to the emitter of the fourth BJT;
the collectors of the third and the fourth BJTs are coupled to a power supply;
the base of the third BJT is coupled to the collector of the first BJT, and the base of the fourth BJT is coupled to the collector of the second BJT;
the bases of the fifth and the sixth BJTs are coupled to the control signal;
the collector of the fifth BJT is coupled to one output of the output signal and the collector of the sixth BJT is coupled to the other output of the output signal;
the bases of the seventh and the eighth BJTs are coupled to a complementary clock signal;
the emitter of the seventh BJT is coupled to the collector of the first BJT, and the emitter of the eighth BJT is coupled to the collector of the second BJT;
the collector of the seventh BJT is coupled to the base of the third BJT, and the collector of the eighth BJT is coupled to the base of the fourth BJT; and
the emitter of the fifth BJT is coupled to the collector of the first BJT, and the emitter of the sixth BJT is coupled to the collector of the second BJT.

16. The method of claim 15, further comprising:
operating a clock feedthrough suppression circuit coupled to the switching circuit, the clock feedthrough suppression circuit configured to suppress harmonics of the control signal.

17. The method of claim 15, wherein the operation of the grounding circuit comprises operating a gain adjustment circuit, wherein the ratio between a value of the output signal and a corresponding value of the input signal is responsive to a gain value of the gain adjustment circuit.

18. The method of claim 15, wherein the operation of the grounding circuit comprises operating a bandwidth enhancement circuit to control a frequency response of the input amplifier circuit, the bandwidth enhancement circuit comprising a capacitor and a resistor.

19. A track-and-hold circuit comprising:
an input amplifier circuit configured to provide an output signal responsive to an input signal, the input amplifier circuit comprising one or more transistors in a common emitter configuration;
a switching circuit configured, in response to a control signal, to couple the input amplifier circuit to an output circuit in a first mode or to isolate the input amplifier circuit from the output circuit in a second mode;
the output circuit configured to track a value of the output signal when the switching circuit is in a first mode and to hold the value of the output signal when the switching circuit is in a second mode; and
a grounding circuit coupled between the input amplifier circuit and an electrical ground, wherein:
the one or more transistors comprise a first bipolar junction transistor (BJT) and a second BJT;
the switching circuit comprises a third BJT, a fourth BJT, a fifth BJT, a sixth BJT, a seventh BJT and an eighth BJT;
the emitter of the first BJT is coupled to the emitter of the second BJT;
the gate of the first BJT is coupled to one input of the input signal, and the gate of the second BJT is coupled to the other input of the input signal;
the collector of the first BJT is coupled to the emitter of the third BJT, and the collector of the second BJT is coupled to the emitter of the fourth BJT;
the collectors of the third and the fourth BJTs are coupled to a power supply;
the base of the third BJT is coupled to the collector of the first BJT, and the base of the fourth BJT is coupled to the collector of the second BJT;
the bases of the fifth and the sixth BJTs are coupled to the control signal;
the collector of the fifth BJT is coupled to one output of the output signal and the collector of the sixth BJT is coupled to the other output of the output signal;
the bases of the seventh and the eighth BJTs are coupled to a complementary clock signal;
the emitter of the seventh BJT is coupled to the collector of the first BJT, and the emitter of the eighth BJT is coupled to the collector of the second BJT;
the collector of the seventh BJT is coupled to the base of the third BJT, and the collector of the eighth BJT is coupled to the base of the fourth BJT; and
the emitter of the fifth BJT is coupled to the collector of the first BJT, and the emitter of the sixth BJT is coupled to the collector of the second BJT.

20. The track-and-hold circuit of claim 19, wherein the one or more transistors are a pair of bipolar junction transistors, and wherein the output circuit comprises a pair of metal oxide semiconductor (MOS) transistors configured in an emitter follower configuration.

* * * * *